(12) United States Patent
Hwang et al.

(10) Patent No.: US 12,021,107 B2
(45) Date of Patent: Jun. 25, 2024

(54) SYSTEMS AND METHODS FOR BREAKDOWN VOLTAGE CORRECTION IN GEIGER-MODE AVALANCHE PHOTODIODE (APD) FOCAL PLANE ARRAYS (FPA)

(71) Applicant: LG INNOTEK CO., LTD., Seoul (KR)

(72) Inventors: Harold Hwang, Princeton, NJ (US); Matthew T. O'Grady, Newtown, PA (US); Brian Edward Piccione, Yardley, PA (US); Mark Itzler, Princeton, NJ (US)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/832,270

(22) Filed: Jun. 3, 2022

(65) Prior Publication Data

US 2023/0395641 A1 Dec. 7, 2023

(51) Int. Cl.
*H01L 27/146* (2006.01)
*H01L 31/107* (2006.01)
*H04N 25/75* (2023.01)

(52) U.S. Cl.
CPC .. *H01L 27/14643* (2013.01); *H01L 27/14609* (2013.01); *H01L 31/107* (2013.01); *H04N 25/75* (2023.01)

(58) Field of Classification Search
CPC .. H01L 27/14609; H01L 31/107; H04N 25/75
See application file for complete search history.

(56) References Cited

U.S. PATENT DOCUMENTS

| 6,222,660 | B1 | 4/2001 | Traa |
| 8,903,588 | B2 | 12/2014 | Schmüdderich et al. |
| 8,948,995 | B2 | 2/2015 | Pandita et al. |
| 9,731,713 | B2 | 8/2017 | Horii |
| 9,911,030 | B1 | 3/2018 | Zhu et al. |
| 10,267,908 | B2 | 4/2019 | Luders et al. |
| 10,268,203 | B2 | 4/2019 | Wisniowski |
| 10,345,437 | B1 | 7/2019 | Russell et al. |
| 10,545,505 | B2 | 1/2020 | Sakai |

(Continued)

OTHER PUBLICATIONS

Alharbi et al., "Context-Aware Sensor Uncertainty Estimation for Autonomous Vehicles," Vehicles, Oct. 25, 2021, 3, 721-735, https://doi.org/10.3390/vehicles3040042; 15 pages.

(Continued)

*Primary Examiner* — Thanh Luu
(74) *Attorney, Agent, or Firm* — Birch, Stewart, Kolasch & Birch, LLP

(57) ABSTRACT

Systems and methods are described for optical processing. According to some aspects an apparatus may include a pixelated photodiode array (PDA), wherein each pixel in the PDA includes a radiation detector. The optical processing apparatus may also include a memory that stores one or more characteristics for each pixel in the PDA, and a read out integrated circuit (ROIC) communicatively coupled to the FPA and the memory. In some aspects, the ROIC reads from the memory the one or more characteristics for each pixel in the PDA, and adjusts an arm/disarm bias voltage for each pixel in the PDA based on the one or more characteristics of each pixel.

13 Claims, 5 Drawing Sheets

(56) References Cited

U.S. PATENT DOCUMENTS

| | | | |
|---|---|---|---|
| 2015/0177394 A1* | 6/2015 | Dolinsky | G01T 1/208 |
| | | | 250/252.1 |
| 2017/0328729 A1 | 11/2017 | Zhu et al. | |
| 2018/0231654 A1 | 8/2018 | Bilik et al. | |
| 2018/0284268 A1 | 10/2018 | McWhirter | |
| 2018/0374889 A1 | 12/2018 | Cao et al. | |
| 2019/0018416 A1 | 1/2019 | Gassend | |
| 2019/0146071 A1 | 5/2019 | Donovan | |
| 2020/0379465 A1 | 12/2020 | Adam et al. | |
| 2021/0116550 A1* | 4/2021 | Entwistle | G01S 7/4865 |
| 2023/0124216 A1* | 4/2023 | Miyanohara | G01S 7/4863 |
| | | | 356/5.01 |

OTHER PUBLICATIONS

Dulian et al., "Physically constrained short-term vehicle trajectory forecasting with naïve semantic maps," arXiv preprint, arXiv:2006.05159. Jun. 9, 2020; 11 pages.

Puphal et al., "Probabilistic Uncertainty-Aware Risk Spot Detector for Naturalistic Driving," IEEE Transactions on Intelligent Vehicles, vol. 4, No. 3, pp. 406-415, Sep. 2019, doi: 10.1109/TIV.2019.2919465; 10 pages.

\* cited by examiner

SYSTEMS AND METHODS FOR BREAKDOWN VOLTAGE CORRECTION IN GEIGER-MODE AVALANCHE PHOTODIODE (APD) FOCAL PLANE ARRAYS (FPA)

FIELD

The present disclosure relates generally to operations of focal plane arrays (FPAs). More particularly, the present disclosure relates to implementing systems and methods for improving performance of FPAs by correcting a breakdown voltage of individual detectors in the FPA—resulting in overall performance improvement and maximizing production yield.

BACKGROUND

Modern-day vehicles can be configured to operate in an autonomous mode in which the vehicle navigates through an environment with little or no input from a driver. Such autonomous vehicles can include one or more sensors that detect information about the environment in which the vehicle operates. The autonomous vehicle (AV) and its associated computer-implemented controller use the detected information to navigate through the environment. For example, if the sensors detect that the AV is approaching an obstacle, as determined by the computer-implemented controller, the controller adjusts the AV's directional controls to cause the AV to navigate around the obstacle. Accordingly, autonomous navigation depends heavily on vehicle sensors to accurately detect and map out environmental conditions encountered by the AV. One such sensor is a light detection and ranging (lidar) device. A lidar device actively estimates distances to environmental features while scanning through a scene to assemble a cloud of point positions indicative of the three-dimensional shape of the environmental scene. Individual points are measured by generating a laser pulse and detecting a returning pulse, if any, reflected from an environmental object, and determining the distance to the reflective object according to the time delay between the emitted pulse and the reception of the reflected pulse. Other sensors may include infrared (IR) sensors and other imaging sensors (e.g., focal plane arrays (FPAs)) that provide data points to enable autonomous navigation.

FPAs are image sensors consisting of arrays of light-sensing elements (e.g., pixels) at a focal plane of a lens. FPAs may be used for imaging purposes (e.g., taking pictures or video imagery) as well as non-imaging purposes such as spectrometry, wave-front sensing, lidar, and other sensor applications.

Limitations in semiconductor device fabrication (e.g., III-V semiconductor devices such as FPAs) often result in some non-performant devices on a fabricated wafer and/or large variation in device performance and characteristics. In the case of Geiger-mode avalanche photodiode (GMAPD) devices, one of the characteristics that can vary at the wafer level is the breakdown voltage. For FPAs in which each pixel contains a GMAPD device, the variation in breakdown voltage among these pixels leads to variation in pixel-level attributes such as photon detection efficiency, noise rates, and other performance characteristics. Existing FPAs are operated by applying a single voltage bias $V_b$ to all pixels of the array. Critical GMAPD performance parameters depend on an overbias $V_{ov}$ voltage, which is the difference between the total bias $V_b$ and the breakdown voltage $V_{br}$–i.e., $V_{ov}=V_b-V_{br}$. Ideally, a focal plane array consisting of GMAPDs would have identical performance from pixel to pixel by applying the same overbias $V_{ov}$ to all pixels. However, if a single value of voltage bias $V_b$ is applied to all pixels and the breakdown voltage $V_{br}$ varies from pixel to pixel, then $V_{ov}$ will vary from pixel to pixel, along with the performance parameters that depend on $V_{ov}$.

The inability of a system deploying FPAs to compensate for variabilities of breakdown voltage from pixel to pixel will lead to variation of detection capabilities of the FPA—resulting in reduced accuracy and performance of the FPA and the underlying system deploying it (e.g., AV). Accordingly, improving the overall uniformity of performance of FPAs with pixel-level variation will be vital for the operation of FPAs, thereby improving the detection capabilities of the respective sensors and the autonomous navigation of the AV. The present systems and methods of this disclosure address the aforementioned problems.

SUMMARY

Disclosed herein, in accordance with aspects, are systems and methods for optical processing. According to some aspects, an optical processing apparatus is disclosed, the apparatus comprising a pixelated photodiode array (PDA), wherein each pixel in the PDA includes a radiation detector; a memory configured to store one or more characteristics for each pixel in the PDA, and a read out integrated circuit (ROIC) communicatively coupled to the PDA and the memory. According to some aspects, the ROIC may be configured to read, from the memory, the one or more characteristics for each pixel in the PDA, and adjust an arm/disarm bias voltage for each pixel in the PDA based on the one or more characteristics.

According to some aspects, an optical processing method is disclosed, the method comprising reading, from a memory by a readout integrated circuit (ROIC), one or more characteristics for each pixel in a pixelated photodiode array (PDA), each pixel in the PDA including a respective radiation detector, wherein the ROIC is communicatively coupled to the PDA and the memory. The method may also comprise adjusting, by the ROIC, an arm/disarm bias voltage for each pixel in the PDA based on the one or more characteristics.

According to some aspects, a read out integrated circuit (ROIC) communicatively coupled to a pixelated photodiode array (PDA) and a memory is disclosed. The ROIC may be configured to store characteristics for each pixel in the PDA, wherein each pixel in the PDA includes a radiation detector. The ROIC may be further configured to read from the memory the characteristics for each pixel in the PDA, and adjust an arm/disarm bias voltage for each pixel in the PDA based on a respective characteristic of each pixel.

BRIEF DESCRIPTION OF THE DRAWINGS

The accompanying drawings are incorporated herein and form a part of the specification.

In the drawings, like reference numbers generally indicate identical or similar elements. Additionally, generally, the left-most digit(s) of a reference number identifies the drawing in which the reference number first appears.

DETAILED DESCRIPTION

Figure 1:
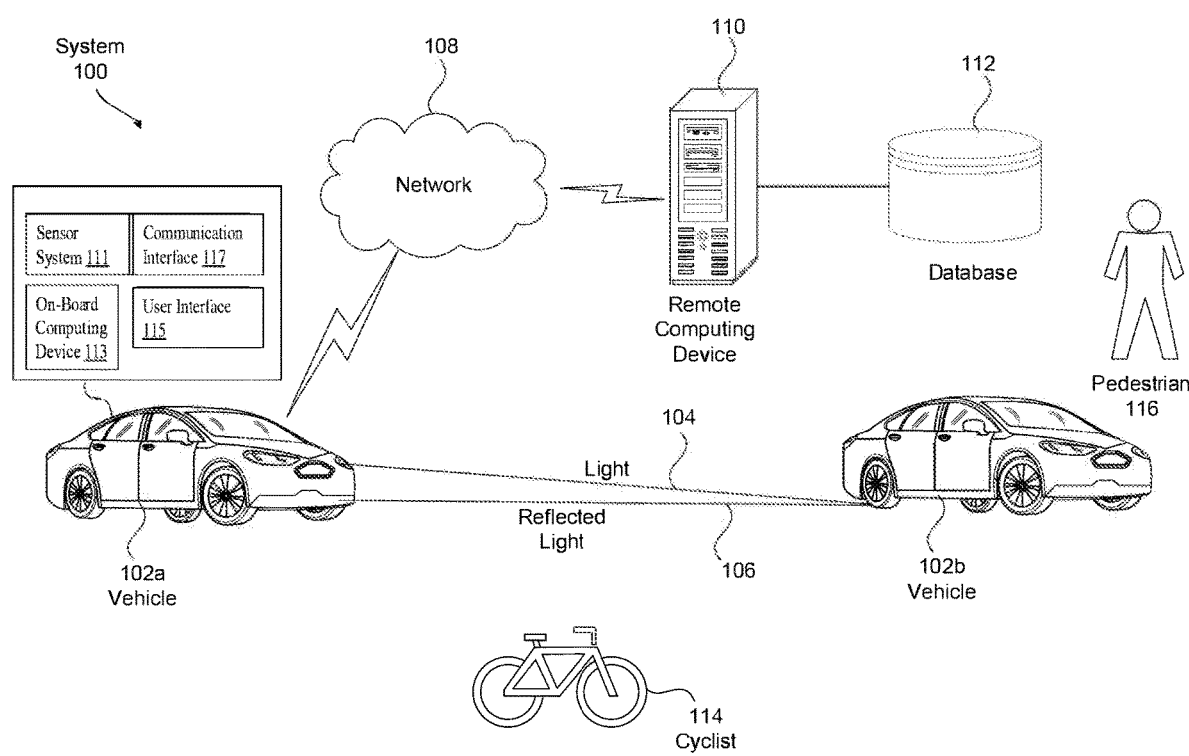
FIG. 1 illustrates an exemplary autonomous vehicle system, in accordance with aspects of the disclosure.

The development and mass production of autonomous vehicles (AVs) has the potential to revolutionize transportation mobility and safety. AVs combine a variety of sensors to perceive their surroundings, such as radar, lidar, sonar, GPS, odometry, and inertial measurement devices. In some aspects, advanced control systems may interpret sensory information to identify appropriate navigation paths, as well as to detect obstacles and relevant signage.

One key sensor that AVs rely on is lidar, which relies on systems and methods for determining ranges by targeting an object with a laser and measuring the time for the reflected light to return to the receiver. According to some aspects, lidar may be used to make digital 3-D representations of areas of a perception region (e.g., an area surrounding the AV). Within the 3-D representations (also known as lidar grids), a lidar computing system, or an on-board computing device (such as computing device 220 discussed herein) may detect a moving object within the perception region, may generate one or more possible object trajectories for the detected object and the AV, and may analyze the possible object trajectories to assess the probability of a collision between the object and the AV. The performance and accuracy of the sensor system, including the lidar, enable an AV to successfully navigate a route irrespective of the obstacles. To this end, the hardware components making up a sensor like lidar need to operate at optimum performance.

Manufacturing sensors, such as lidar, can include acceptable tolerance of non-performant parts. For example, limitations in semiconductor device fabrication (e.g., III-V semiconductor devices such as FPAs) often result in some non-performant devices on a fabricated wafer and/or variations in the performance of such devices. In other words, a manufactured FPA may include a number of non-performant pixels that may affect the overall performance of the FPA, and thereby, the overall performance of the sensor, e.g., lidar, and the autonomous navigation operation.

When manufacturing FPAs, a manufacturer may discover a number of FPAs have a high level of non-performant elements (e.g., noisy, leaky, non-functioning pixels, or pixels with variable turn on voltages) that may degrade the performance of the FPA. Typically, such discovery leads a manufacturer to either discard such FPA (thereby significantly reducing the yield of production) or deploying the FPAs within the field (thereby leading to reduced detection accuracy and sub-optimal sensor performance). To address these concerns, the present disclosure provides for systems and methods that selectively correct breakdown voltages of non-performing elements. It can be appreciated that such systems may be deployed during a manufacturing process, e.g., during testing, and also in the field, e.g., during operation.

According to aspects of the present disclosure, systems and methods are provided for improved detection of objects by managing the arming operations on a per-pixel level of an FPA. This enables the system to compensate or correct for breakdown voltage variations of pixels in the FPA that can adversely affect and degrade the performance of other nearby pixels. The benefits provided by the embodiments discussed herein decrease processing time and bandwidth, and can further enable on-board computing device 220 to generate faster object trajectories. This is especially important for AVs operating in the field, where faster and more accurate detection and decision-making capabilities (due to decreased processing time and bandwidth) can help an AV generate and execute faster navigation-based decisions, thereby resulting in improved autonomous navigation operations of the AV. As also noted herein, the reduction of processing time and bandwidth also improves power consumption, thereby increasing a total range of a battery-operated AV for example.

It can be appreciated that the techniques described herein provide several benefits over existing systems. For example, existing systems provide global biasing of all the PDA pixels to the same armed state. In this case, pixel-level performance variation and the resulting variable data can provide sub-optimal outputs from the FPA. The ability to correct breakdown voltage when the APD operates in Geiger-mode, as described in the present disclosure, provides higher-performing FPAs and also leads to higher FPA module yield for manufacturers.

In some aspects, the selective voltage bias adjustments to compensate for breakdown voltage variation may be done at a testing phase during module assembly or in the field. As will be further described herein, the disclosure also provides for circuitry that can allow for adjustments to be done in the field. For example, in factory-level tests, the effective breakdown voltage of any given pixel is determined to be the voltage at which the pixel first starts to generate a non-zero dark count rate for Geiger-mode measurements. This type of measurement could be made in the field as well. It would also be possible to make direct measurements of other performance parameters—e.g., the photon detection efficiency (PDE)—and make voltage bias corrections that essentially equalize the PDE across the FPA. Accordingly, the disclosed solutions provide for corrective measures of FPAs that develop pixel performance variation while deployed in operation. For example, where an FPA is deployed in an AV and pixel-level performance uniformity degradation is detected, voltage bias adjustments to compensate for the breakdown voltage variation may be performed. Such performance improvements provide benefits for manufacturers and system integrators alike. For example, a manufacturer can produce a higher FPA module yield by leveraging the selective biasing techniques described herein (rather than discarding the FPAs). Moreover, system integrators that integrate the FPAs in the field, e.g., in lidar systems or other sensors, can extract higher performance from each deployed FPA by also leveraging the selective biasing techniques to compensate for breakdown voltage variations. This, in turn, leads to improved detection capabilities of the sensor (e.g., lidar), leading to improved autonomous navigation with regard to speed and accuracy.

The following may be an example description of a solution (autonomous vehicle and associated sensors) incorporating the systems and methodologies described herein. It can be appreciated by those skilled in the art that such an example is not limiting, and other applications within other sensors and solutions may also be deployed.

According to some aspects, the term "vehicle" refers to any moving form of conveyance that is capable of carrying either one or more human occupants and/or cargo and is powered by any form of energy. The term "vehicle" includes, but is not limited to, cars, trucks, vans, trains, autonomous vehicles, aircraft, aerial drones, and the like. An "autonomous vehicle" (or "AV") is a vehicle having a processor, programming instructions and drivetrain components that are controllable by the processor without requiring a human operator. An autonomous vehicle may be fully autonomous in that it does not require a human operator for most or all driving conditions and functions, or it may be semi-autonomous in that a human operator may be required in certain conditions or for certain operations, or that a human operator may override the vehicle's autonomous system and may take control of the vehicle.

Notably, the present solution is being described herein in the context of an autonomous vehicle. However, the present solution is not limited to autonomous vehicle applications. The present solution may be used in other applications such as robotic applications, radar system applications, metric applications, and/or system performance applications. It can be appreciated that the embodiments used herein describe aspects of the present solution. It can also be appreciated that all embodiments are exemplary and can be combined with other embodiments.

FIG. 1 illustrates an exemplary autonomous vehicle system 100, in accordance with aspects of the disclosure. System 100 comprises a vehicle 102a that is traveling along a road in a semi-autonomous or autonomous manner Vehicle 102a is also referred to herein as autonomous vehicle (AV) 102a. AV 102a can include, but is not limited to, a land vehicle (as shown in FIG. 1), an aircraft, or a watercraft.

AV 102a is generally configured to detect objects 102b, 114, and 116 in proximity thereto. The objects can include, but are not limited to, a vehicle 102b, cyclist 114 (such as a rider of a bicycle, electric scooter, motorcycle, or the like) and/or a pedestrian 116. When such a detection is made, AV 102a performs operations to generate one or more possible object trajectories for the detected object and analyze at least one of the generated possible object trajectories to determine whether or not there is an undesirable level of probability that a collision will occur between the AV and object in a threshold period of time (e.g., 1 minute). This may also be referred to as collision probability assessment hereinafter. If so, the AV 102a performs operations to determine whether the collision can be avoided if a given vehicle trajectory is followed by the AV 102a and any one of a plurality of dynamically generated emergency maneuvers is performed in pre-defined time period (e.g., N milliseconds). If the collision can be avoided, then the AV 102a takes no action or optionally performs a cautious maneuver (e.g., mildly slows down). In contrast, if the collision cannot be avoided, then the AV 102a immediately takes an emergency maneuver (e.g., brakes and/or changes direction of travel). Other approaches to collision detection and avoidance by AV 102a are contemplated by this disclosure as would be understood by one skilled in the relevant art.

As will be described in greater detail in association with FIG. 3, AV 102a may be configured with a lidar system 300. Lidar system 300 may include a light emitter system 304 (transmitter) that transmits a light pulse 104 to detect objects located within a distance or range of distances of AV 102a. Light pulse 104 may be incident on one or more objects (e.g., AV 102b) and be reflected back to lidar system 300. Reflected light pulse 106 incident on light detector 308 is processed by lidar system 300 to determine a distance of that object to AV 102a. Light detector 308 may, in some embodiments, contain a photodetector or array of photodetectors positioned and configured to receive the light reflected back into the system. For example, light detector 308 may contain a focal plane array including a photodiode array (PDA) and a readout integrated circuit (ROIC). According to some aspects, each pixel of the PDA may be electrically connected to a dedicated channel of the ROIC such that the ROIC controls the arming and disarming of individual PDA pixels through a bias circuit as will be further described herein. According to some aspects, the PDA may contain Geiger-mode avalanche photodiodes (GmAPD), which is capable of providing single photon detection levels.

In some aspects, silicon photodiodes convert light into an electrical signal. This conversion occurs when photons having more energy than the bandgap of the detector material are absorbed, exciting an electron from the valence band of the semiconductor to the conduction band, where it is read out as a signal. GmAPDs use the same process, but they generate internal gain using an avalanche multiplication process. An avalanche region is produced within the APD, creating an area of very high electric field strength. When a photogenerated (or thermally generated) electron in the conduction band moves into the avalanche region, the electric field strength is sufficient to accelerate it to the point at which it can cause "impact ionization" and liberate another electron. Both of these electrons can be accelerated as well, creating an avalanche multiplication. This process results in detector gain. Typical gains for an APD are in the range of ten to a few hundred.

Geiger-mode operation can increase the modest gain of an APD to a more significant level. The gain of an APD increases with stronger internal electric field but remains finite up to a threshold breakdown electric field $E_b$ established by a corresponding externally applied breakdown voltage $V_b$. For applied voltages less than $V_b$, the output photocurrent of the APD is proportional to the input optical intensity, and device operation below the breakdown voltage is referred to as "linear mode". In contrast, applied voltages greater than $V_b$ lead to a finite probability that a single carrier injected into the avalanche region will trigger a self-sustaining avalanche characterized by divergent (i.e., infinite) gain. This rapid generation of easily measured avalanche currents triggered by just a single photoexcited carrier allows for the efficient detection of single photons. In practical operation, the self-sustaining Geiger-mode avalanches are quenched once they are detected. In this case, one refers to an effective gain given by the number of charges (typically $>>10^5$) that flow in response to the injection of just a single electron into the avalanche region.

In some cases, the quenching and the reset of the GmAPD can be accomplished passively by placing a sufficiently large resistor in series with the detector. A fixed bias voltage is applied across the series combination of the GmAPD and the resistor. When no current is flowing, the entire bias is dropped across the GmAPD, and it is in its "armed" state. When the junction breaks down, a large current flows through the resistor, and the resulting voltage drop across the resistor reduces the voltage across the GmAPD, allowing the avalanche process to passively quench into the "disarmed" state. In other cases, when avalanche breakdown is detected, the bias voltage is actively reduced below the breakdown voltage and the GmAPD avalanche is actively quenched. Following either type of quenching to the "disarmed" state, the bias voltage across the GmAPD is then reset to a value above the breakdown voltage so that it is again armed to make subsequent detections. The discharge-and-reset cycle is known as the Geiger mode of operation.

Figure 4:
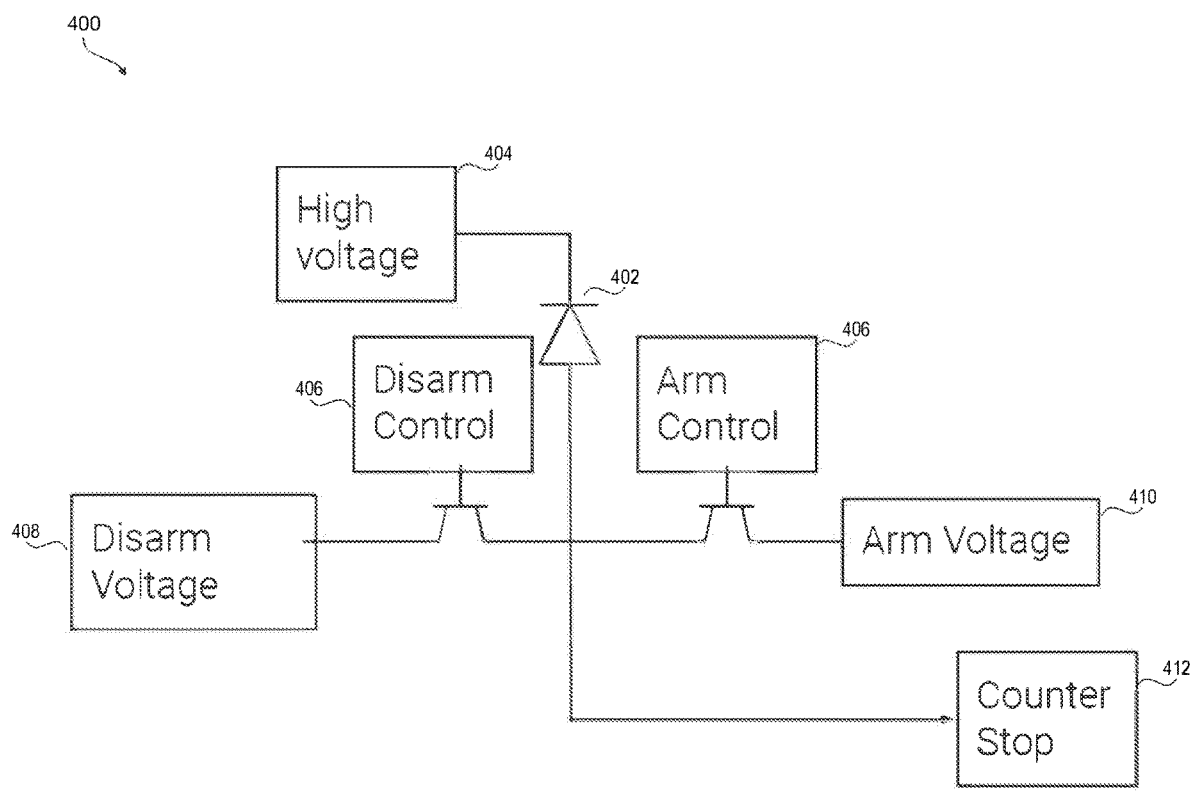
FIG. 4 illustrates an exemplary schematic biasing circuit, in accordance with aspects of the disclosure.

As will be further discussed with regard to FIG. 4, aspects of the disclosure aim to selectively adjust voltage biases of pixels to compensate for breakdown voltage variation to achieve a desired detection efficiency (e.g., uniform or otherwise specified). For FPAs using GmAPDs, the PDA may be armed and disarmed by manipulating a net applied reverse voltage in relation to a GmAPD breakdown voltage. For example, a PDA may be armed when the net applied reverse voltage is above a breakdown voltage of the GmAPD. Similarly, a PDA may be disarmed when the net applied reverse voltage is below the GmAPD breakdown voltage. It can be appreciated that by increasing the reverse voltage to a bias above the breakdown voltage, the PDA is considered armed. According to some aspects, a total voltage on the PDA may be the sum of a fixed negative DC bias voltage ($V_{dc}$) and an additional arming bias applied by the ROIC. For example, for an arming bias in which an arming transistor switches between +5V and 0V (ground), the (negative) sum $V_{dc}$+5V leaves the PDA in the disarmed state. In other words, instead of arming the entire PDA, the present disclosure enables voltage bias adjustments to compensate for breakdown voltage variations between each pixel to achieve a desired detection efficiency. The selective biasing described herein may be performed through a biasing circuit, as described in FIG. 4.

Figure 2:
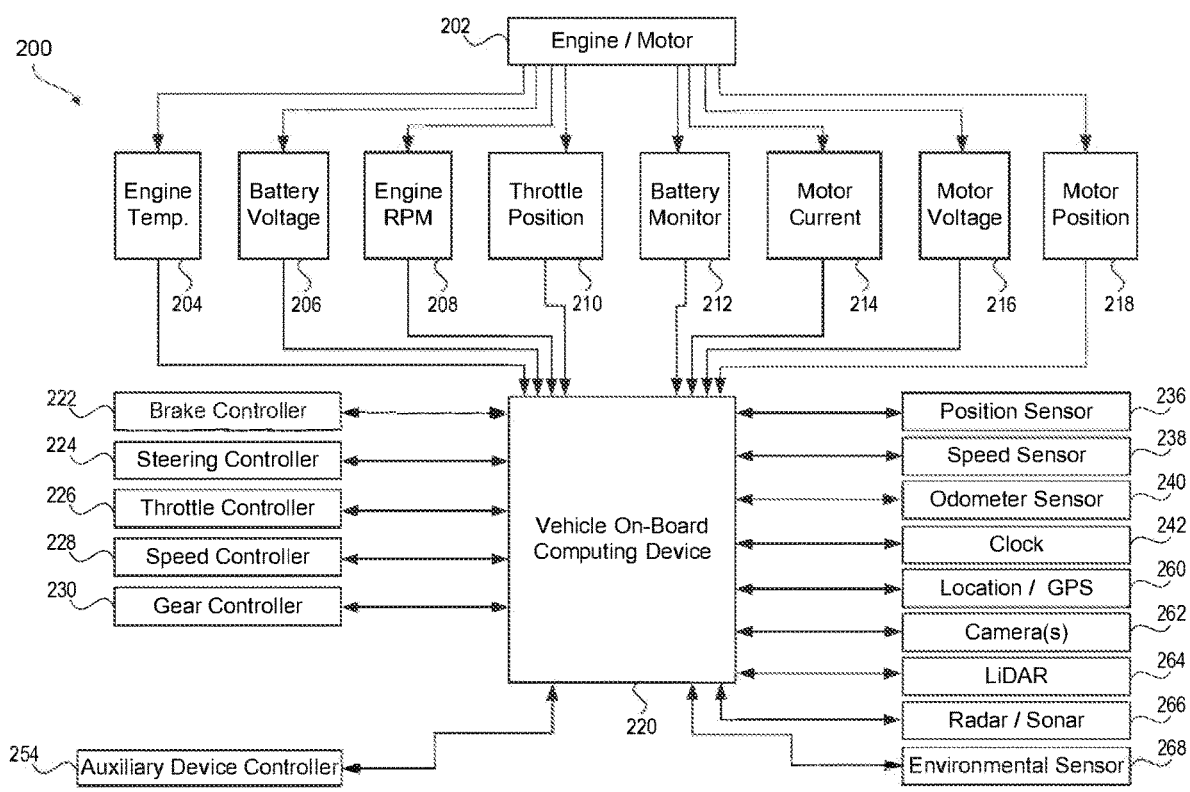
FIG. 2 illustrates an exemplary architecture for a vehicle, in accordance with aspects of the disclosure.

Lidar information, such as detected object data, is communicated from lidar system 300 to an on-board computing device 220 (FIG. 2). AV 102a may also communicate lidar data to a remote computing device 110 (e.g., cloud processing system) over communications network 108. Remote computing device 110 may be configured with one or more servers to process one or more processes of the technology described herein. Remote computing device 110 may also be configured to communicate data/instructions to/from AV 102a over network 108, to/from server(s) and/or database(s) 112.

Network 108 may include one or more wired or wireless networks. For example, the network 108 may include a cellular network (e.g., a long-term evolution (LTE) network, a code division multiple access (CDMA) network, a 3G network, a 4G network, a 5G network, another type of next generation network, etc.). The network may also include a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, and/or the like, and/or a combination of these or other types of networks.

AV 102a may retrieve, receive, display, and edit information generated from a local application or delivered via network 108 from database 112. Database 112 may be configured to store and supply raw data, indexed data, structured data, map data, program instructions or other configurations as is known.

FIG. 2 illustrates an exemplary system architecture 200 for a vehicle, in accordance with aspects of the disclosure. Vehicles 102a and/or 102b of FIG. 1 can have the same or similar system architecture as that shown in FIG. 2. Thus, the following discussion of system architecture 200 is sufficient for understanding vehicle(s) 102a and/or 102b of FIG. 1. However, other types of vehicles are considered within the scope of the technology described herein and may contain more or fewer elements as described in association with FIG. 2. As a non-limiting example, an airborne vehicle may exclude brake or gear controllers, but may include an altitude sensor. In another non-limiting example, a water-based vehicle may include a depth sensor. One skilled in the art will appreciate that other propulsion systems, sensors and controllers may be included based on a type of vehicle, as is known.

As shown in FIG. 2, system architecture 200 includes an engine or motor 202 and various sensors 204-218 for measuring various parameters of the vehicle. In gas-powered or hybrid vehicles having a fuel-powered engine, the sensors may include, for example, an engine temperature sensor 204, a battery voltage sensor 206, an engine Rotations Per Minute ("RPM") sensor 208, and a throttle position sensor 210. If the vehicle is an electric or hybrid vehicle, then the vehicle may have an electric motor, and accordingly includes sensors such as a battery monitoring system 212 (to measure current, voltage, and/or temperature of the battery), motor current 214 and voltage 216 sensors, and motor position sensors 218 such as resolvers and encoders.

Operational parameter sensors that are common to both types of vehicles include, for example: a position sensor 236 such as an accelerometer, gyroscope, and/or inertial measurement unit; a speed sensor 238; and an odometer sensor 240. The vehicle also may have a clock 242 that the system uses to determine vehicle time during operation. The clock 242 may be encoded into the vehicle's on-board computing device, it may be a separate device, or multiple clocks may be available.

The vehicle also includes various sensors that operate to gather information about the environment in which the vehicle is traveling and to detect objects. These sensors may include, for example: a location sensor 260 (e.g., a Global Positioning System ("GPS") device); one or more cameras 262; a lidar system 264; and/or a radar and/or a sonar system 266. The sensors also may include environmental sensors 268 such as a precipitation sensor and/or ambient temperature sensor. The object detection sensors may enable the vehicle to detect objects that are within a given distance range of the vehicle 200 in any direction, while the environmental sensors collect data about environmental conditions within the vehicle's area of travel.

During operations, information is communicated from the sensors to a vehicle on-board computing device 220. The vehicle on-board computing device 220 analyzes the data captured by the sensors and optionally controls operations of the vehicle based on results of the analysis. For example, the vehicle on-board computing device 220 may control: braking via a brake controller 222; direction via a steering controller 224; speed and acceleration via a throttle controller 226 (in a gas-powered vehicle) or a motor speed controller 228 (such as a current level controller in an electric vehicle); a differential gear controller 230 (in vehicles with transmissions); and/or other controllers. Auxiliary device controller 254 may be configured to control one or more auxiliary devices, such as testing systems, auxiliary sensors, mobile devices transported by the vehicle, etc.

Geographic location information may be communicated from the location sensor 260 to the vehicle on-board computing device 220, which may then access a map of the environment that corresponds to the location information to determine known fixed features of the environment such as streets, buildings, stop signs and/or stop/go signals. Captured images from the cameras 262 and/or object detection information captured from sensors such as lidar system 264 is communicated (from those sensors) to the on-board computing device 220. The object detection information and/or captured images are processed by the on-board computing device 220 to detect objects in proximity to the vehicle 200. Any known or to be known technique for making an object detection based on sensor data and/or captured images can be used in the embodiments disclosed in this document.

Lidar information, as captured by detector 308 for example, is communicated from lidar system 264 to the on-board computing device 220. Additionally, captured images are communicated from the camera(s) 262 to the vehicle on-board computing device 220. The lidar information and/or captured images are processed by the vehicle on-board computing device 220 to detect objects in proximity to the vehicle 200. The manner in which the object detections are made by the vehicle on-board computing device 220 includes such capabilities detailed in this disclosure.

As can be appreciated by those skilled in the art, improving the detecting capabilities of lidar system 264, and more specifically, detector 308, the vehicle on-board computing device 220 can receive more accurate detections and generate more accurate object tracking and trajectories for detected objects. This leads to improved autonomous navigation because at least one sensor in the vehicle sensor suite is providing improved and more accurate detection information. Such improvements provide for more downstream benefits. For example, processing more accurate information can lead the vehicle on-board computing device 220 to perform analysis and provide solutions on a faster rate because less computing bandwidth may be spent on checking sensor accuracy data.

Figure 3:
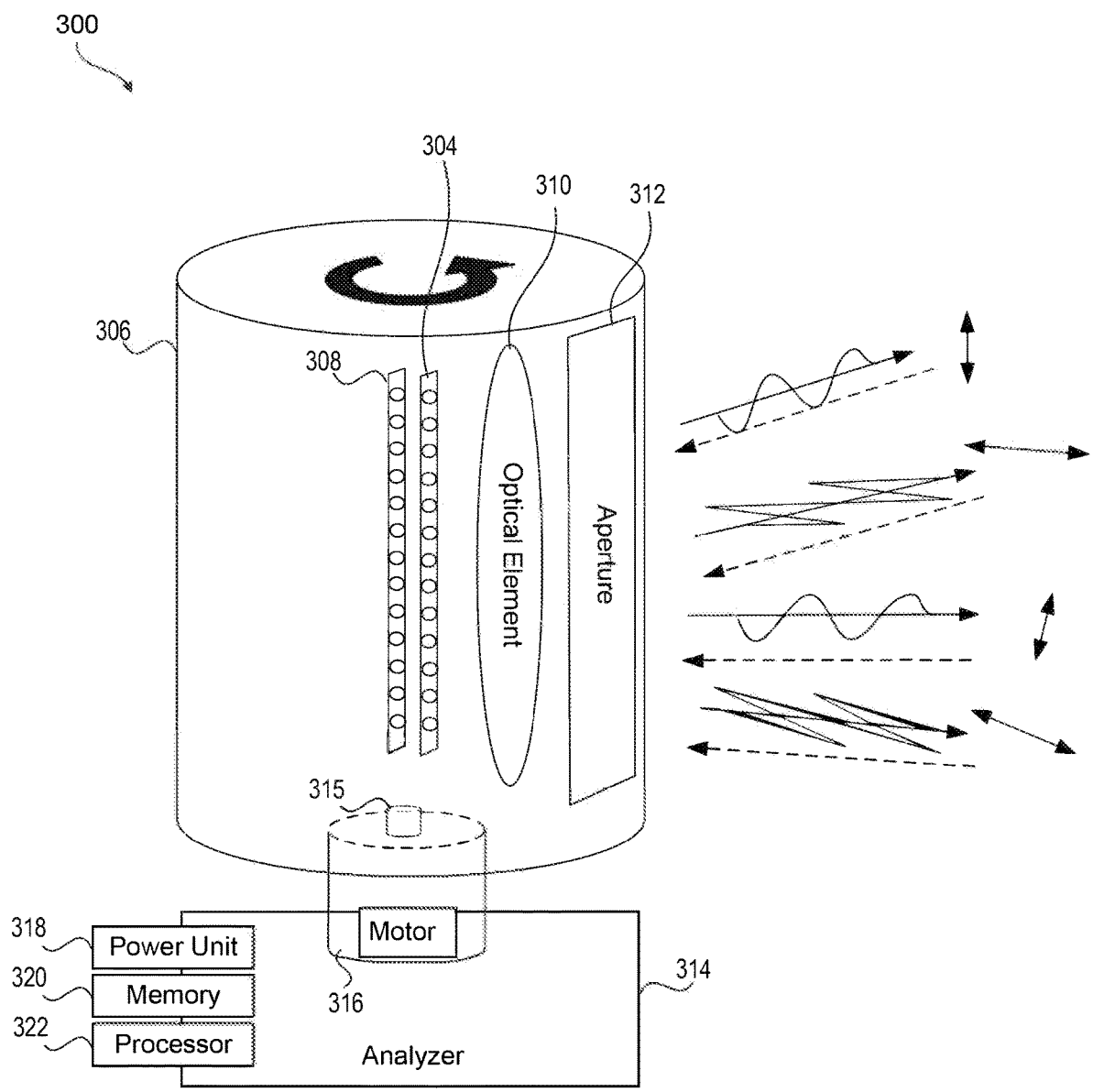
FIG. 3 illustrates an exemplary architecture for a lidar system, in accordance with aspects of the disclosure.

FIG. 3 illustrates an exemplary architecture for a lidar system 300, in accordance with aspects of the disclosure. In some aspects, lidar system 264 of FIG. 2 may be the same as or substantially similar to the lidar system 300. As such, the discussion of lidar system 300 is sufficient for understanding lidar system 264 of FIG. 2.

As shown in FIG. 3, the lidar system 300 includes a housing 306 which may be rotatable 360° about a central axis such as hub or axle 315 of motor 316. The housing may include an emitter/receiver aperture 312 made of a material transparent to light. Although a single aperture is shown in FIG. 3, the present solution is not limited in this regard. In other scenarios, multiple apertures for emitting and/or receiving light may be provided. In each scenario, the lidar system 300 can emit light through one or more of the aperture(s) 312 and receive reflected light back toward one or more of the aperture(s) 212 as the housing 306 rotates around the internal components. In an alternative scenario, the outer shell of housing 306 may be a stationary dome, at least partially made of a material that is transparent to light, with rotatable components inside the housing 306.

Inside the rotating shell or stationary dome is a light emitter system 304 that is configured and positioned to generate and emit pulses of light through the aperture 312 or through the transparent dome of the housing 306 via one or more laser emitter chips or other light-emitting devices. The emitter system 304 may include any number of individual emitters (e.g., 8 emitters, 64 emitters, or 128 emitters). The emitters may emit light of substantially the same intensity or of varying intensities. The lidar system also includes a light detector 308 containing a photodetector or array of photodetectors (e.g., a focal plane array (FPA) including a photodiode array (PDA) and/or a Geiger mode PDA) positioned and configured to receive light reflected back into the system. In one example, the light emitter system 304 and light detector 308 would rotate with the rotating shell, or they would rotate inside the stationary dome of the housing 306. It can be appreciated that the mechanical lidar system described herein is but an example lidar system relied on by aspects of the present solution and that other examples of lidar systems, such as solid-state lidar systems may also be implemented.

In some aspects, one or more optical element structures 310 may be positioned in front of the light emitter system 304 and/or the light detector 308 to serve as one or more lenses or waveplates that focus and direct light that is passed through the optical element structure 310.

One or more optical element structures 310 may be positioned in front of a mirror (not shown) to focus and direct light that is passed through the optical element structure 310 (e.g., such as in a focal plane array). The system includes an optical element structure 310 positioned in front of a mirror and connected to the rotating elements of the system so that the optical element structure 310 rotates with the mirror. Alternatively or in addition, the optical element structure 310 may include multiple such structures (for example lenses and/or waveplates). Optionally, multiple optical element structures 310 may be arranged in an array on or integral with the shell portion of the housing 306.

According to some aspects, lidar system 300 includes a power unit 318 to power the light emitting system 304, a motor 316, and electronic components. Lidar system 300 also includes an analyzer 314 with elements such as a processor 322 and non-transitory computer-readable memory 320 containing programming instructions that are configured to enable the system to receive data collected by the light detector unit, analyze it to measure characteristics of the light received, and generate information that a connected system can use to make decisions about operating in an environment from which the data was collected. Optionally, the analyzer 314 may be integral with the lidar system 300 as shown, or some or all of it may be external to the lidar system and communicatively connected to the lidar system via a wired or wireless communication network or link.

According to some aspects, lidar system 300 may generate and provide an output to a vehicle on-board computing system (e.g., on board computing device 220). Such output may include a three-dimensional (3-D) mapping of a perception region (an area illuminated by lidar 264 or lidar system 300. According to some aspects, the three-dimensional mapping may also be referred to as the lidar grid, where grid cells may each provide a proportional representation of the perception region. When an object is detected within the lidar grid, on-board computing device 220 may attempt to generate a point cloud mapping (e.g., a lidar grid) including the detected object to then generate a collision threat assessment and potential navigation instructions to other AV systems. Accordingly, the systems and methods for improving the detection capabilities and performance of FPA are described herein with regard to FIGS. 4-5 below.

FIG. 4 illustrates an exemplary partial schematic of a focal plane array (FPA) 400, according to some embodiments. FPA 400 may include photodiode 402, high voltage source 404, arm/disarm control circuit 406, disarm voltage 408, arm voltage 410, and counter stop 412. It can be appreciated that manipulation of the arm and disarm voltages can provide the requisite biasing voltage adjustments to compensate for breakdown voltage variations. According to some aspects, FPA 400 may include a pixelated photodiode array (PDA) that includes photodiode 402. According to some aspects, the PDA may include Geiger-mode avalanche photodiodes (GmAPDs). According to some aspects, arm/disarm control circuit 406 along with disarm voltage 408, arm voltage 410, and counter stop 412 may be part of a readout integrated circuit (ROIC). It can be appreciated that the ROIC may be included as part of FPA 400. According to some aspects, the ROIC may also be fabricated outside of FPA 400.

According to some aspects, high voltage source 404 may be connected to a cathode of photodiode 402. Photodiode 402 may be a GmAPD photodiode. According to some aspects, arm/disarm control circuit 406 may be configured as a biasing circuit to dynamically raise a bias voltage (e.g., high voltage supply) to be above the breakdown voltage of photodiode 402. In one example, when an avalanche event occurs (e.g., when light is received), arm/disarm control circuit 406 quenches (i.e., stops) the avalanche current, and a counter stop mechanism is triggered. In some aspects, to prevent the photodiode from being armed above its breakdown voltage, the arm/disarm control circuit 406 may not assert the arming control signal. According to some aspects, the arm/disarm control circuit 406 may be a stand-alone device within FPA 400. Alternatively, arm/disarm control circuit 406 may be part of an ROIC within FPA 400. It can be appreciated that the ROIC may be a silicon-based integrated circuit performing any number of electronic functionalities beyond the outputs of the photodiodes in the PDA.

It can be appreciated that the PDA may be a pixelated photodiode array where each pixel in the PDA includes a radiation detector such as photodiode 402. Moreover, while FIG. 4 illustrates a single biasing circuit, it can be appreciated that the PDA interfaces to a plurality of biasing circuits each connected to a respective radiation detector (e.g., photodiode 402) to selectively compensate for breakdown voltage variations. As noted herein, the selective compensating for the breakdown voltage variations may depend on observed performance of each photodiode 402 in the PDA such that variable pixels (e.g., pixels with different observed breakdown voltages than an expected, average, desired amount for the circuit) may be selectively compensated according to aspects of the disclosure.

As described herein, aspects of the disclosure provide for the compensating of pixel performance variation by providing addressable pixel-level biasing circuits, such as arm/disarm control circuit 406, that selectively compensate for breakdown voltage variations. In this regard, arm/disarm circuit 406 may manipulate the arm/disarm voltage supply to an arming transistor to compensate for the breakdown voltage variability. In one example, arm/disarm circuit 406 may manipulate the voltage supply of the arming transistor to its +5V rail and not allow the transistor to be pulled to ground. This forces the associated PDA pixel to disarm (or remain in a disarmed state) thereby resetting the PDA pixel. To place a pixel in an armed state, arm/disarm control circuit 406 may apply a net reverse voltage value above the breakdown voltage of photodiode 402.

It can be appreciated that the detection of pixel-level variation may be performed during a testing phase and a status of the pixels may be stored as part of a deselect map. In some aspects, the deselect map may indicate status of each pixel in the PDA and the type of fault that may be associated with each pixel, if any, including any measured/detected variation in the breakdown voltage. For example, the deselect map may include a status associated with photodiode 402 indicating that the photodiode is non-performing. It can be appreciated that other non-performing status may be stored in the deselect map, including, but not limited to, observed dark current values above a predetermined dark current threshold, and/or observed leakage current level above a predetermined leakage current threshold value.

According to some aspects, the following is an example illustrating the selectable biasing of the breakdown voltage of a photodiode to arm at a desired bias voltage based on the physical attributes of the photodiode itself. As described earlier, critical GMAPD performance parameters depend on an overbias $V_{ov}$, which is the difference between the total bias $V_b$ and the breakdown voltage $V_{br}$–i.e., $V_{ov}=|V_b-V_{br}|$. Ideally, a focal plane array consisting of GMAPDs would have identical performance from pixel to pixel by applying the same overbias $V_{ov}$ to all pixels. However, if a single value of voltage bias $V_b$ is applied to all pixels and the breakdown voltage $V_{br}$ varies from pixel to pixel, then $V_{ov}$ will vary from pixel to pixel, along with the performance parameters that depend on $V_{ov}$. As noted herein, semiconductor wafer fabrication and processing can lead to large variations in device performance and characteristics. Such variation may be manifested in devices operating at different nominal breakdown voltages (e.g., a first device in the PDA operating at a first nominal breakdown voltage, $V_{br1}$, and a second device in the PDA operating at a second nominal breakdown voltage, $V_{br2}$). A nominal breakdown voltage value is a value threshold above which a single electron-hole pair can trigger an avalanche event. In one example, $V_{br1}$ may be of a different value than $V_{br2}$ (e.g., −80V vs. −79V). It can be appreciated that the values discussed herein are exemplary, and other nominal values may be measured and compensated for. According to some aspects, a total voltage on the PDA may be the sum of a fixed negative DC bias voltage ($V_{dc}$) and an additional arm/disarm bias $V_{a/d}$ applied by the ROIC. In current practices, an ROIC connected to the PDA is programmed to provide the same arm/disarm bias voltages ($V_{arm}$ and $V_{disarm}$) across the entire PDA. Accordingly, given that $V_{dc}$ is the same fixed value across the entire PDA, using an ROIC arming voltage $V_{arm}$ of 0 V (i.e., ground) across the entire PD may result in the first device having a different overbias voltage $V_{ov}$ than the second device. For example, assuming $V_{dc}$=−83 V and $V_{arm}$=0 V, the first device (with $V_{br1}$=−80 V) would be operating at an overbias of $V_{ov}$=3 V while the second device (with $V_{br1}$=−79 V) would be operating at an overbias of $V_{ov}$=4 V. The value of the overbias voltage $V_{ov}$ is the key factor in determining GmAPD performance, and variation in $V_{ov}$ across the PDA results in different detection capabilities and characteristics when the devices are armed. To address this deficiency, arm/disarm control circuit 406 may vary the arming bias $V_{arm}$ so that the first and second devices with different values—e.g., $V_{arm1}$ and $V_{arm2}$—can have the same overbias voltage value. That is, irrespective of the variation in the physical attributes of the different photodiodes in the array, arm/disarm control circuit 406 provides for voltage bias adjustments that compensate for the breakdown voltage variation. This ensures uniform detection efficiency of the APD.

According to some aspects, to generate variable adjustments for a bias voltage to compensate for the breakdown voltage variation and ensure a uniform detection efficiency of the APD, arm/disarm control circuit 406 may be arranged in a manner as follows: photodiode 402 may be connected to high voltage source 404 at a cathode end while connecting to arm/disarm circuit 406 at an anode end. In one example, high voltage source 404 may supply a high voltage sufficient enough to bias photodiode 402 above its breakdown voltage and/or up to a desired voltage level above the breakdown voltage.

The following are examples illustrative of arm and disarm states controlled by arm/disarm control circuit 406. In arming and disarming the respective PDA pixels, arm/disarm control circuit also controls bias values for each respective pixel that compensate for any variation in measured breakdown voltages of each pixel. It can be appreciated that the values illustrated in the following scenarios are exemplary, and other values may also be considered and implemented as those skilled in the art would understand.

Disarm state: in one example, disarm voltage 408 may be a +5V voltage while arm voltage 410 may be 0V (e.g., ground). In this example, arm/disarm control circuit 406 may apply disarm voltage 408 at the anode of photodiode 402 to generate a reverse bias voltage sufficient enough to disarm photodiode 402. For example, if high voltage 404 is −83 V, then arm/disarm circuit 406 applying the +5V at the anode reverse biases the photodiode 402 to a value of −78 V, which is below its nominal breakdown voltage of −80 V. This results in disarming photodiode 402.

Arm state for first device in the APD: in one example, arm/disarm control circuit 406 may apply an arm voltage sufficient to keep the reverse bias value across photodiode 402 above its nominal breakdown voltage of $V_{br1}=-80$ V. In this case, arm voltage 410 may be set to 0 V and photodiode 402 may be operating at −83 V, which is a 3V overbias above its nominal breakdown voltage of −80 V.

Arm state for second device in the APD: assume now that a second device in the APD has a different nominal breakdown voltage. As noted herein, an example of a nominal breakdown voltage $V_{br2}$ may be higher or lower than $V_{br1}$. Assuming that $V_{br2}$ is lower than $V_{br1}$, e.g., −79 V, arm/disarm control circuit 406 may set arm voltage 410 to +1 V, and the second device (not shown) may then operate at −82 V, which is an overbias voltage of 3 V above its nominal voltage value of −79 V. Therefore, even though the two devices have different breakdown voltages, they can both be operated at the same 3 V overbias voltage. By compensating for breakdown voltage variation, arm/disarm control circuit 406 can achieve a uniform overbias voltage, leading to corresponding uniformity in performance parameters that directly depend on overbias, such as photon detection efficiency.

Accordingly, aspects of the disclosure provide for equalizing the applied overbias for all pixels (e.g., photodiodes) by implementing pixel-dependent voltage bias swings (e.g., control of the arming voltage values) via arm/disarm control circuit 406 for example. In doing so, each ROIC channel may be programmed to switch its corresponding PDA pixel from the disarm voltage (e.g., +5V rail) to a selectable voltage value that can be above ground. In this way, variation in the breakdown voltage can be compensated by correlated pixel-level variation in the voltage bias such that all pixel overbias voltage values are equivalent. According to some aspects of the disclosure, selectively applying different arming voltages by the ROIC leads to a uniform overbias voltage ($V_{ov}=3$ V) for all pixels in a PDA. As illustrated in the above example, for two pixels that have different breakdown voltages (e.g., −80 V and −79 V for $V_{br1}$ and $V_{br2}$ respectively) selectively applying different arming voltages leads to uniform overbias voltage operation for the PDA, leading to a more uniform and predictable performance as well.

As noted herein with regard to existing GMAPD FPAs, inherent process variation in the PDAs remains a limiting factor in the uniformity of FPA performance This can affect device yield significantly if the performance variation is too great to be acceptable in the application space. Existing FPAs employ ROICs with voltage biasing that is identical for all array pixels, and PDA-level variation leads to variation in the overall FPA behavior. According to some aspects, an advantage of the systems and methods of the present disclosure is that they compensate for the inherent PDA-level variability and limitations of current semiconductor processing technology using additional functionality in the ROIC to equalize pixel-level biasing. This creates more uniform FPA performance and improves the overall yield of devices that meet system-level requirements.

Figure 5:
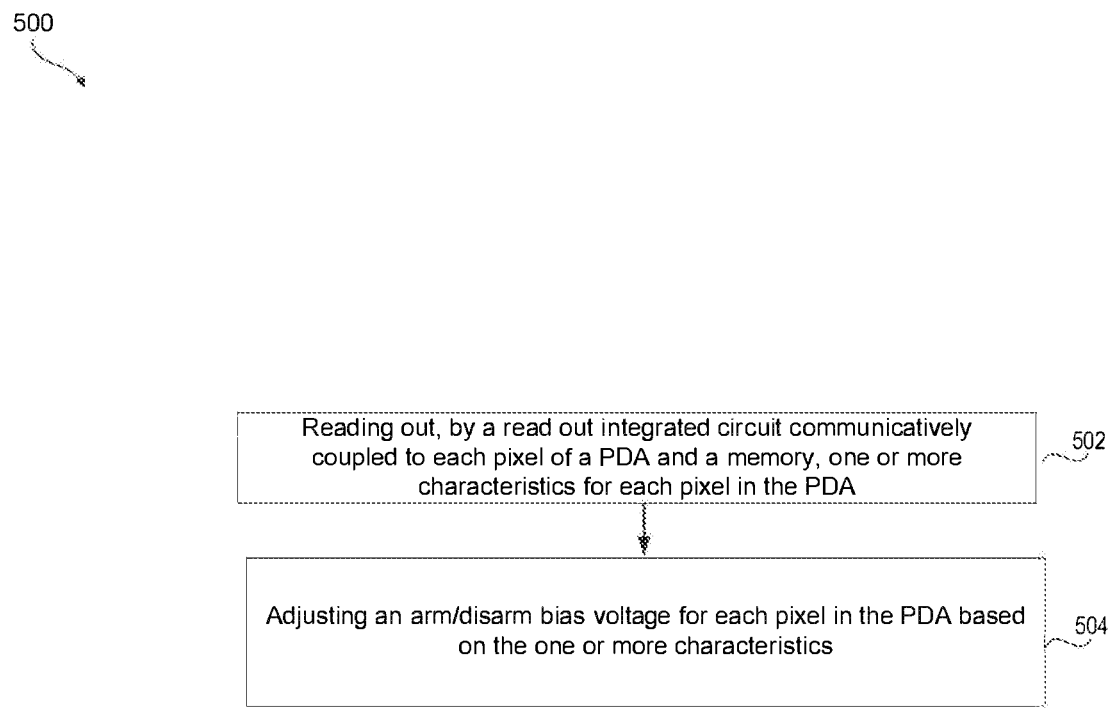
FIG. 5 illustrates a process for biasing pixels in a focal plane array (FPA), in accordance with aspects of the disclosure.

FIG. 5 illustrates an exemplary optical process 500 for performing the biasing operations described herein. According to some aspects, process 500 may include storing, in a memory of an optical processing device, one or more characteristics for each pixel of a pixelated photodiode array (PDA) within a focal plane array (FPA), (not shown). For example, the storing may be performed at a testing phase of the FPA during a production process to determine performance metrics of the FPA. According to some aspects, the one or more characteristics of each pixel may relate to observed performance during the testing, including, for example, noise levels, leakage current, breakdown voltage (e.g., nominal breakdown voltage), and the like.

According to some aspects, process 500 further includes reading out, by a read out integrated circuit communicatively coupled to each pixel of the PDA and the memory, the one or more characteristics for each pixel in the PDA, as illustrated in step 502. The readout may include reading out the nominal breakdown voltage of the pixel to determine any potential bias voltage requirements for operating the pixel in Geiger mode. According to some aspects, process 500 further includes adjusting an arm/disarm bias voltage for each pixel in the PDA based on the readout one or more characteristics of each pixel, as illustrated in step 504. It can be appreciated that each pixel in the PDA may include Geiger-mode avalanche photodiodes (GmAPD) such that the one or more characteristics include a breakdown voltage of the GmAPD. As noted herein, the breakdown voltage variation can be compensated by the arm/disarm control circuit 406 in order to equalize the pixel level biasing. According to some aspects described in FIG. 4, the bias voltage of each pixel can be adjusted upwards in response to the breakdown voltage of the pixel being below a predetermined threshold (e.g., a nominal breakdown voltage for an entire APD). Similarly, the bias voltage of a pixel can be adjusted downwards in response to the breakdown voltage of the pixel being above the predetermined threshold.

According to some aspects, the bias voltage for each pixel may be adjusted in the PDA based on the respective breakdown voltage to enable each pixel to operate in an armed state, thereby enabling the detection of incoming photons. According to some aspects, a reverse bias may be adjusted, from a bias source that supplies a reverse bias to each pixel in the PDA (e.g., disarm voltage 408) to a predetermined arming bias value (e.g., a voltage above the nominal breakdown voltage for the respective pixel of the PDA) to arm each pixel and a predetermined disarming bias value to disarm each pixel. In this regard, adjusting the reverse bias may be performed by arm/disarm control circuit 406 to a value above the breakdown voltage value stored in the memory for each pixel of the PDA in order to arm each pixel of the PDA.

According to some aspects, the reverse bias may be further adjusted to a value below the breakdown voltage value stored in the memory for each pixel of the PDA in order to disarm each pixel of the PDA. It can be appreciated that in view of the inconsistencies of the performance variations of the PDA due to the fabrication processes, the stored performance characteristics for one pixel in the PDA may be different from stored performance characteristics for another pixel in the PDA (e.g., pixels may have different breakdown voltage characteristics).

It is to be appreciated that the detailed description section, and not any other section, is intended to be used to interpret the claims. Other sections can set forth one or more but not all exemplary aspects as contemplated by the inventor(s), and thus, are not intended to limit this disclosure or the appended claims in any way.

For example, according to some aspects described with reference to FIGS. 1-5, an optical processing apparatus is disclosed. According to some aspects, the apparatus comprises a pixelated photodiode array (PDA), wherein each pixel in the PDA includes a radiation detector; a memory configured to store one or more characteristics for each pixel in the PDA, and a read out integrated circuit (ROIC) communicatively coupled to the PDA and the memory. According to some aspects, the ROIC being configured to read, from the memory, the one or more characteristics for each pixel in the PDA, and adjust an arm/disarm bias voltage for each pixel in the PDA based on the one or more characteristics.

According to some aspects, each pixel in the PDA comprises one or more Geiger-mode avalanche photodiodes (GmAPDs) wherein the one or more characteristics read from the memory include a breakdown voltage of the one or more GmAPDs. According to some aspects, the ROIC is further configured to: adjust the arm/disarm bias voltage of a pixel upwards in response to the breakdown voltage of the pixel being below a predetermined threshold. According to some aspects, the ROIC is further configured to adjust the arm/disarm bias voltage of a pixel downwards in response to the breakdown voltage of the pixel being above a predetermined threshold. According to some aspects, the ROIC is further configured to adjust the arm/disarm bias voltage for each pixel in the PDA based on the respective breakdown voltage such that each pixel operates in an armed state.

According to some aspects, the apparatus may also include a bias source configured to supply the arm/disarm bias voltage to each pixel of the PDA, wherein the ROIC is further configured to: adjust the arm/disarm bias voltage to a predetermined arming bias value to arm each pixel, and adjust the arm/disarm bias voltage to a predetermined disarming bias value to disarm each pixel. According to some aspects, the ROIC is further configured to adjust the arm/disarm bias voltage to a value above a breakdown voltage value stored in the memory for each pixel of the PDA to arm each pixel of the PDA. According to some aspects, the ROIC is further configured to adjust the arm/disarm bias voltage to a value below the breakdown voltage value stored in the memory for each pixel of the PDA to disarm each pixel of the PDA.

According to some aspects, the one or more characteristics for a first pixel in the PDA are different from the one or more characteristics for a second pixel in the PDA. According to some aspects, the first pixel and the second pixel are configured to operate at the same over bias voltage level after adjustment of the arm/disarm bias voltage.

It can be appreciated that the apparatus comprises a focal plan array (FPA). Moreover, the apparatus can comprise a light detection and ranging sensor (lidar). According to some aspects, the ROIC is configured to adjust the arm/disarm bias voltage for each pixel in the PDA such that each pixel in the PDA operates at the same over bias voltage level.

According to some aspects, an optical processing method is disclosed, the method comprising reading, from a memory by a readout integrated circuit (ROIC), one or more characteristics for each pixel in a pixelated photodiode array (PDA), each pixel in the PDA including a respective radiation detector, wherein the ROIC is communicatively coupled to the PDA and the memory; and adjusting, by the ROIC, an arm/disarm bias voltage for each pixel in the PDA based on the one or more characteristics. According to some aspects, the one or more characteristics read from the memory include a breakdown voltage of the pixel. According to some aspects, the adjusting further comprises adjusting the arm/disarm bias voltage of a pixel upwards in response to the breakdown voltage of the pixel being below a predetermined threshold.

According to some aspects, the adjusting further comprises adjusting the arm/disarm bias voltage of a pixel downwards in response to the breakdown voltage of the pixel being above a predetermined threshold.

According to some aspects, an apparatus, e.g., a read out integrated circuit (ROIC) is disclosed. According to some aspects, the ROIC is communicatively coupled to a pixelated photodiode array (PDA) and a memory configured to store characteristics for each pixel in the PDA, wherein each pixel in the PDA includes a radiation detector. According to some aspects, the ROIC is configured to read from the memory the characteristics for each pixel in the PDA, and adjust an arm/disarm bias voltage for each pixel in the PDA based on a respective characteristic of each pixel. According to some aspects, the one or more characteristics read from the memory include a breakdown voltage for each radiation detector.

While this disclosure describes exemplary aspects for exemplary fields and applications, it should be understood that the disclosure is not limited thereto. Other aspects and modifications thereto are possible, and are within the scope and spirit of this disclosure. For example, and without limiting the generality of this paragraph, aspects are not limited to the software, hardware, firmware, and/or entities illustrated in the figures and/or described herein. Further, aspects (whether or not explicitly described herein) have significant utility to fields and applications beyond the examples described herein.

Aspects have been described herein with the aid of functional building blocks illustrating the implementation of specified functions and relationships thereof The boundaries of these functional building blocks have been arbitrarily defined herein for the convenience of the description. Alternate boundaries can be defined as long as the specified functions and relationships (or equivalents thereof) are appropriately performed. Also, alternative aspects can perform functional blocks, steps, operations, methods, etc. using orderings different than those described herein.

References herein to "one aspect," "an aspect," "an example aspect," or similar phrases, indicate that the aspect described can include a particular feature, structure, or characteristic, but every aspect can not necessarily include the particular feature, structure, or characteristic. Moreover, such phrases are not necessarily referring to the same aspect. Further, when a particular feature, structure, or characteristic is described in connection with an aspect, it would be within the knowledge of persons skilled in the relevant art(s) to incorporate such feature, structure, or characteristic into other aspects whether or not explicitly mentioned or described herein. Additionally, some aspects can be described using the expression "coupled" and "connected" along with their derivatives. These terms are not necessarily intended as synonyms for each other. For example, some aspects can be described using the terms "connected" and/or "coupled" to indicate that two or more elements are in direct physical or electrical contact with each other. The term "coupled," however, can also mean that two or more elements are not in direct contact with each other, but yet still co-operate or interact with each other.

The breadth and scope of this disclosure should not be limited by any of the above-described exemplary aspects, but should be defined only in accordance with the following claims and their equivalents.

It is to be appreciated that the Detailed Description section, and not any other section, is intended to be used to interpret the claims. Other sections can set forth one or more but not all exemplary embodiments as contemplated by the inventor(s), and thus, are not intended to limit this disclosure or the appended claims in any way.

While this disclosure describes exemplary embodiments for exemplary fields and applications, it should be understood that the disclosure is not limited thereto. Other embodiments and modifications thereto are possible, and are within the scope and spirit of this disclosure. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof The boundaries of these functional building blocks have been arbitrarily defined herein for the convenience of the description. Alternate boundaries can be defined as long as the specified functions and relationships (or equivalents thereof) are appropriately performed. Also, alternative embodiments can perform functional blocks, steps, operations, methods, etc. using orderings different than those described herein.

References herein to "one embodiment," "an embodiment," "an example embodiment," or similar phrases, indicate that the embodiment described can include a particular feature, structure, or characteristic, but every embodiment can not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein. Additionally, some embodiments can be described using the expression "coupled" and "connected" along with their derivatives. These terms are not necessarily intended as synonyms for each other. For example, some embodiments can be described using the terms "connected" and/or "coupled" to indicate that two or more elements are in direct physical or electrical contact with each other. The term "coupled," however, can also mean that two or more elements are not in direct contact with each other, but yet still co-operate or interact with each other.

The breadth and scope of this disclosure should not be limited by any of the above-described exemplary embodiments, but should be defined only in accordance with the following claims and their equivalents.

What is claimed is:

1. An apparatus comprising:
a pixelated photodiode array (PDA), wherein each pixel in the PDA includes a radiation detector;
a memory configured to store at least one characteristic for each pixel in the PDA; and
a read out integrated circuit (ROIC) communicatively coupled to the PDA and the memory, the ROIC being configured to:
read, from the memory, the at least one characteristic for each pixel in the PDA,
adjust an arm/disarm bias voltage for each pixel in the PDA based on least one characteristic,
wherein the ROIC is further configured to:
adjust the arm/disarm bias voltage of the pixel upwards in response to the breakdown voltage of the pixel being below a predetermined threshold or downwards in response to the breakdown voltage of the pixel being above a predetermined threshold.

2. The apparatus of claim 1, wherein each pixel in the PDA comprises one or more Geiger-mode avalanche photodiodes (GmAPDs).

3. The apparatus of claim 2, wherein the at least one characteristic includes a breakdown voltage of the one or more GmAPDs.

4. The apparatus of claim 3, wherein the ROIC is further configured to adjust the arm/disarm bias voltage for each pixel in the PDA based on the respective breakdown voltage such that each pixel operates in an armed state.

5. The apparatus of claim 1, further comprising:
a bias source configured to supply the arm/disarm bias voltage to each pixel of the PDA,
wherein the ROIC is further configured to:
adjust the arm/disarm bias voltage to a predetermined arming bias value to arm each pixel, and
adjust the arm/disarm bias voltage to a predetermined disarming bias value to disarm each pixel.

6. The apparatus of claim 5, wherein the ROIC is further configured to adjust the arm/disarm bias voltage to a value above the breakdown voltage value stored in the memory for each pixel of the PDA to arm each pixel of the PDA.

7. The apparatus of claim 6, wherein the ROIC is further configured to adjust the arm/disarm bias voltage to a value below the breakdown voltage value stored in the memory for each pixel of the PDA to disarm each pixel of the PDA.

8. The apparatus of claim 1, wherein the at least one characteristic for a first pixel in the PDA is different from the at least one characteristic for a second pixel in the PDA.

9. The apparatus of claim 8, wherein the first pixel and the second pixel are configured to operate at the same over bias voltage level after adjustment of the arm/disarm bias voltage.

10. The apparatus of claim 1, wherein the apparatus comprises a focal plan array (FPA).

11. The apparatus of claim 1, wherein the apparatus comprises a light detection and ranging sensor (lidar).

12. The apparatus of claim 1, wherein the ROIC is configured to adjust the arm/disarm bias voltage for each pixel in the PDA such that each pixel in the PDA operates at the same over bias voltage level.

13. A method comprising:
reading, from a memory by a readout integrated circuit (ROIC) at least one characteristic for each pixel in a pixelated photodiode array (PDA), each pixel in the PDA including a respective radiation detector, wherein the ROIC is communicatively coupled to the PDA and the memory; and
adjusting, by the ROIC, an arm/disarm bias voltage for each pixel in the PDA based on the at least one characteristic,
wherein the adjusting further comprises:
adjusting the arm/disarm bias voltage of the pixel upwards in response to the breakdown voltage of the pixel being below a predetermined threshold or downwards in response to the breakdown voltage of the pixel being above the predetermined threshold.

* * * * *